United States Patent
Song et al.

(10) Patent No.: US 10,418,244 B2
(45) Date of Patent: Sep. 17, 2019

(54) MODIFIED SELF-ALIGNED QUADRUPLE PATTERNING (SAQP) PROCESSES USING CUT PATTERN MASKS TO FABRICATE INTEGRATED CIRCUIT (IC) CELLS WITH REDUCED AREA

(71) Applicant: QUALCOMM Incorporated, San Diego, CA (US)

(72) Inventors: Stanley Seungchul Song, San Diego, CA (US); Giridhar Nallapati, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 15/408,796

(22) Filed: Jan. 18, 2017

(65) Prior Publication Data

US 2018/0204765 A1 Jul. 19, 2018

(51) Int. Cl.
*H01L 21/768* (2006.01)
*H01L 23/528* (2006.01)
(Continued)

(52) U.S. Cl.
CPC ........ *H01L 21/0338* (2013.01); *G03F 7/0002* (2013.01); *H01L 21/0337* (2013.01);
(Continued)

(58) Field of Classification Search
CPC ............... G03F 7/0002; H01L 21/0337; H01L 21/0338; H01L 21/3086; H01L 21/76816;
(Continued)

(56) References Cited

U.S. PATENT DOCUMENTS 7,396,781 B2 7/2008 Wells
8,084,310 B2 12/2011 Mebarki et al.
(Continued)

OTHER PUBLICATIONS

International Search Report and Written Opinion for PCT/US2017/065569, dated Jun. 26, 2018, 21 pages.
(Continued)

*Primary Examiner* — Vuthe Siek
(74) *Attorney, Agent, or Firm* — Withrow & Terranova, PLLC

(57) ABSTRACT

Aspects describing modified self-aligned quadruple patterning (SAQP) processes using cut pattern masks to fabricate integrated circuit (IC) cells with reduced area are disclosed. In one aspect, a modified SAQP process includes disposing multiple mandrels. First spacers are disposed on either side of each mandrel, and second spacers are disposed on either side of each first spacer. A cut pattern mask is disposed over the second spacers and includes openings that expose second spacers corresponding to locations in which voltage rails are to be disposed. The voltage rails are formed by removing the second spacers exposed by the openings in the cut pattern mask, and disposing the voltage rails in the corresponding locations left vacant by removing the second spacers. Routing lines are disposed over routing tracks formed between each set of the remaining second spacers to allow for interconnecting of active devices formed in the IC cell.

11 Claims, 17 Drawing Sheets

(51) Int. Cl.
*H01L 27/02* (2006.01)
*H01L 21/033* (2006.01)
*G03F 7/00* (2006.01)
*H01L 21/308* (2006.01)
*H01L 27/118* (2006.01)

(52) U.S. Cl.
CPC ...... *H01L 21/3086* (2013.01); *H01L 27/0207* (2013.01); *H01L 27/11807* (2013.01)

(58) Field of Classification Search
CPC ........... H01L 21/76877; H01L 23/5283; H01L 23/5286; H01L 27/0207; H01L 27/11807
See application file for complete search history.

(56) References Cited

U.S. PATENT DOCUMENTS

| | | |
|---|---|---|
| 8,932,955 B1 | 1/2015 | Sel et al. |
| 9,472,414 B2 | 10/2016 | Yang et al. |
| 2010/0148219 A1* | 6/2010 | Shimizu .............. H01L 27/0207 257/207 |
| 2012/0249182 A1* | 10/2012 | Sherlekar ............ G06F 17/5077 326/101 |
| 2012/0280723 A1* | 11/2012 | Scott ................ H03K 19/01857 327/108 |
| 2015/0371959 A1* | 12/2015 | Frederick, Jr. .......... H01L 23/58 361/748 |
| 2016/0049307 A1 | 2/2016 | Chen |
| 2016/0071771 A1 | 3/2016 | Colburn et al. |
| 2016/0225640 A1 | 8/2016 | Raley et al. |

OTHER PUBLICATIONS

Bbardon, M. Garcia et al., "Extreme Scaling Enabled by 5 Tracks Cells: Holistic Design-Device Co-optimization for FinFETs and Lateral Nanowires," 2016 IEEE International Electron Devices Meeting (IEDM), Dec. 3, 2016, IEEE, 4 pages.
Invitation to Pay Additional Fees and Partial International Search Report for PCT/US2017/065569, dated Mar. 22, 2018, 13 pages.

* cited by examiner

IC CELL
(202) FABRICATION

206(1)

206(3)

206(4)

206(5)

206(6)

206(7)

206(9)

206(10)

MODIFIED SELF-ALIGNED QUADRUPLE PATTERNING (SAQP) PROCESSES USING CUT PATTERN MASKS TO FABRICATE INTEGRATED CIRCUIT (IC) CELLS WITH REDUCED AREA

BACKGROUND

I. Field of the Disclosure

The technology of the disclosure relates generally to integrated circuit (IC) cells fabricated using self-aligned quadruple patterning (SAQP), and particularly to reducing the area of SAQP-based IC cells.

II. Background

Integrated circuits (ICs) can be fabricated using various types of process technologies. One such process technology is referred to as light-based lithography, which uses photoresist material and light of a particular wavelength to etch patterns in an IC. In particular, light-based lithography involves disposing a circuit material to be etched, such as metal, over a semiconductor substrate, such as silicon. A photoresist material is disposed over the circuit material in a manner that causes the photoresist material to shield portions of the circuit material corresponding to a desired pattern. The portions of the circuit material not shielded by the photoresist material are then etched using a light source with a particular wavelength. After the portions of the circuit material have been etched, the photoresist material is removed such that the remaining circuit material forms the desired pattern corresponding to that portion of the IC.

However, conventional light-based lithography processes have particular area constraints attributable to the wavelength of the light source used to etch the circuit material. In particular, the smallest achievable metal pitch is limited by the available wavelength. For example, when etching with a light source having a wavelength equal to forty (40) nanometers (nm), the smallest achievable metal pitch is equal to eighty (80) nm. Such a metal pitch limits how small an IC may be fabricated using light-based lithography. Thus, the area reduction limitations of light-based lithography pose a problem as demands for area reduction of ICs continues to increase.

In this regard, other process technologies not limited by light wavelength may be employed so as to achieve a smaller metal pitch, and thus, a smaller area. For example, self-aligned quadruple patterning (SAQP) is one alternative to light-based lithography that can achieve a metal pitch approximately 75% smaller than a metal pitch of light-based lithography. SAQP involves the use of multiple spacers to determine where particular portions of circuit material, such as metal, are to be disposed. In particular, circuit material layers, such as metal layers, are disposed over routing tracks formed between multiple spacers. However, while SAQP achieves a smaller metal pitch than light-based lithography, area reduction using conventional SAQP is limited due to metal line and voltage rail sizing limitations. Thus, it would be advantageous to achieve the reduced metal pitch of SAQP while also further reducing area of corresponding ICs.

SUMMARY OF THE DISCLOSURE

Aspects disclosed herein include modified self-aligned quadruple patterning (SAQP) processes using cut pattern masks to fabricate integrated circuit (IC) cells with reduced area. In one aspect, a modified SAQP process used to fabricate an IC cell includes disposing multiple mandrels. First spacers are disposed on either side of each mandrel, and second spacers are disposed on either side of each first spacer. Prior to disposing voltage rails in corresponding locations within the IC cell, a cut pattern mask is disposed over the second spacers. In particular, the cut pattern mask includes openings that expose second spacers corresponding to locations in which voltage rails are to be disposed. The voltage rails are formed by removing the second spacers exposed by the openings in the cut pattern mask, and disposing the voltage rails in the corresponding locations left vacant by removing the second spacers. Routing lines are disposed over routing tracks formed between each set of the remaining second spacers to allow for interconnecting of active devices formed in the IC cell. Disposing the voltage rails in place of the removed second spacers allows the voltage rails to be narrower than voltage rails formed using a conventional SAQP process, and also allows for fewer routing lines to be employed in the IC cell. Thus, the modified SAQP process using the cut pattern mask provides an IC cell with the reduced metal pitch of SAQP while also achieving a reduced area.

In this regard in one aspect, an IC cell is provided. The IC cell comprises a first voltage rail configured to receive a first voltage. The IC cell also comprises a second voltage rail disposed substantially parallel to the first voltage rail and configured to receive a second voltage. The IC cell also comprises an even plurality of routing tracks formed between and substantially parallel to the first voltage rail and the second voltage rail. The IC cell also comprises a plurality of routing lines, wherein each routing line of the plurality of routing lines is disposed over a corresponding routing track of the even plurality of routing tracks.

In another aspect, an IC cell is provided. The IC cell comprises a means for receiving a first voltage. The IC cell also comprises a means for receiving a second voltage substantially parallel to the means for receiving the first voltage. The IC cell also comprises an even plurality of means for routing formed between and substantially parallel to the means for receiving the first voltage and the means for receiving the second voltage. The IC cell also comprises a plurality of means for transferring current, wherein each means for transferring current of the plurality of means for transferring current is disposed over a corresponding means for routing of the even plurality of means for routing.

In another aspect, a method for fabricating an IC cell with reduced area using modified SAQP employing a cut pattern is provided. The method comprises disposing one or more mandrels. The method also comprises disposing a plurality of first spacers, wherein each first spacer is disposed adjacent to a corresponding side of a corresponding mandrel of the one or more mandrels. The method also comprises disposing a plurality of second spacers, wherein each second spacer is disposed adjacent to a corresponding side of a corresponding first spacer of the plurality of first spacers. The method also comprises disposing a cut pattern mask. The cut pattern mask comprises a first opening corresponding to a first voltage rail area, wherein the first opening exposes a corresponding second spacer. The cut pattern mask also comprises a second opening corresponding to a second voltage rail area, wherein the second opening exposes a corresponding second spacer. The method also comprises removing the corresponding second spacer exposed by the first opening. The method also comprises removing the corresponding second spacer exposed by the second opening. The method also comprises disposing a first voltage rail between a corresponding set of second spacers. The method also comprises disposing a second voltage rail between a corresponding set of second spacers. The method also comprises disposing a plurality of routing lines over a corresponding plurality of routing tracks formed between each corresponding set of second spacers.

DETAILED DESCRIPTION

Figure 1A:
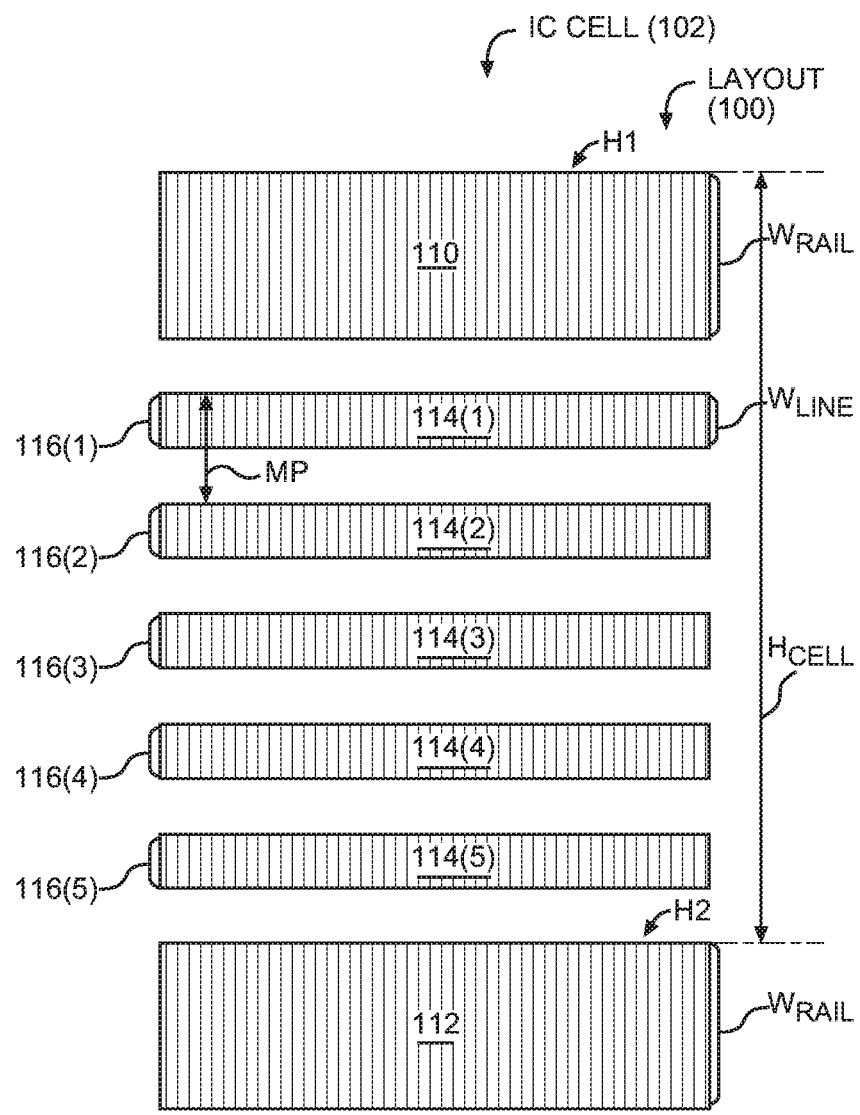
FIG. 1A is a top-view diagram of an exemplary conventional integrated circuit (IC) cell fabricated using a conventional self-aligned quadruple patterning (SAQP) process.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include modified self-aligned quadruple patterning (SAQP) processes using cut pattern masks to fabricate integrated circuit (IC) cells with reduced area. In one aspect, a modified SAQP process used to fabricate an IC cell includes disposing multiple mandrels. First spacers are disposed on either side of each mandrel, and second spacers are disposed on either side of each first spacer. Prior to disposing voltage rails in corresponding locations within the IC cell, a cut pattern mask is disposed over the second spacers. In particular, the cut pattern mask includes openings that expose second spacers corresponding to locations in which voltage rails are to be disposed. The voltage rails are formed by removing the second spacers exposed by the openings in the cut pattern mask, and disposing the voltage rails in the corresponding locations left vacant by removing the second spacers. Routing lines are disposed over routing tracks formed between each set of the remaining second spacers to allow for interconnecting of active devices formed in the IC cell. Disposing the voltage rails in place of the removed second spacers allows the voltage rails to be narrower than voltage rails formed using a conventional SAQP process, and also allows for fewer routing lines to be employed in the IC cell. Thus, the modified SAQP process using the cut pattern mask provides an IC cell with the reduced metal pitch of SAQP while also achieving a reduced area.

Figure 1B:
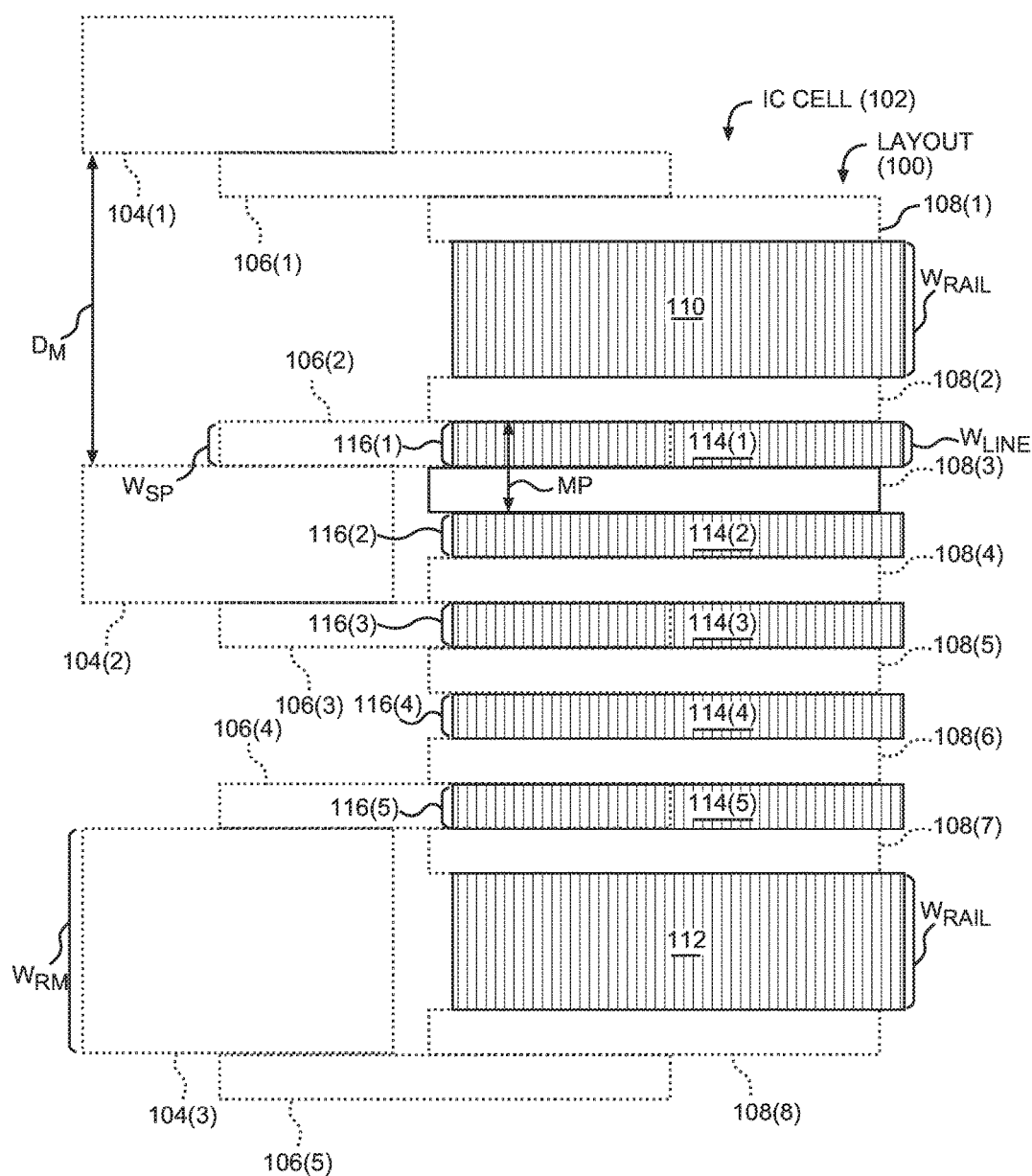
FIG. 1B is a top-view diagram of the conventional IC cell of FIG. 1A that illustrates exemplary mandrels and spacers employed in the conventional SAQP process.
Figure 2A:
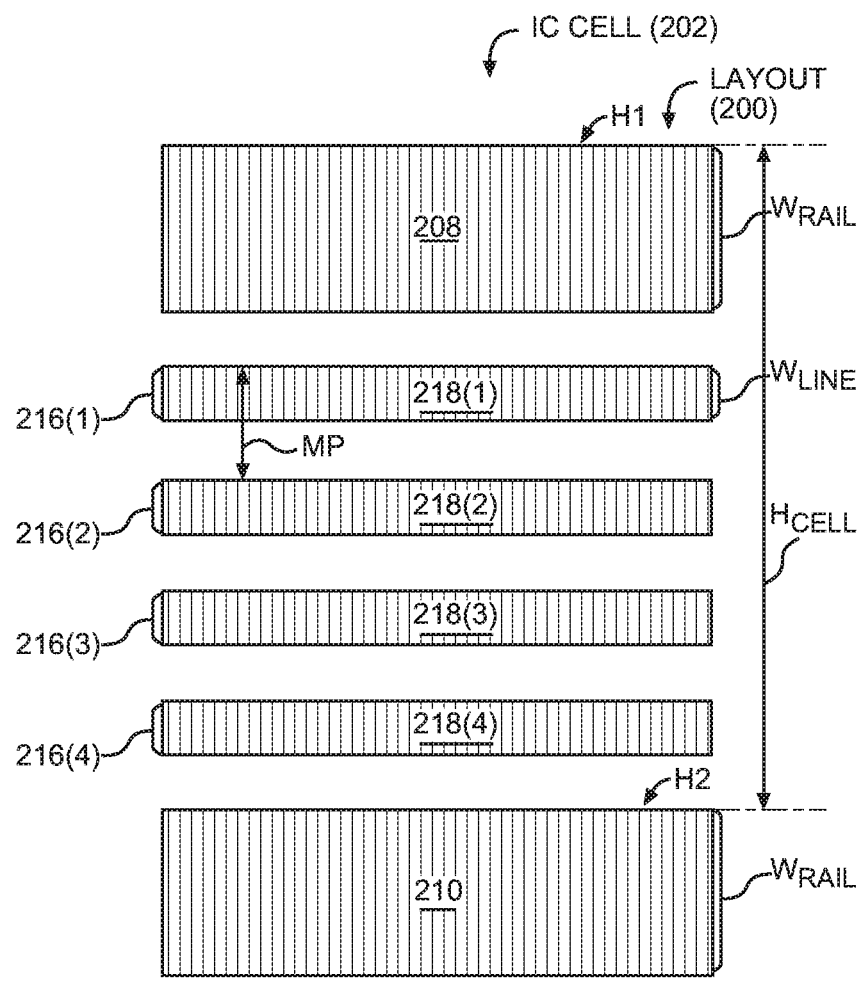
FIG. 2A is a top-view diagram of an exemplary IC cell fabricated using a modified SAQP process that uses a cut pattern mask to remove spacers corresponding to voltage rails so as to achieve a reduced area.

Before discussing the details of modified SAQP processes using cut pattern masks to fabricate IC cells with reduced area beginning in FIG. 2A, a conventional IC cell fabricated using a conventional SAQP process is first described. In this regard, FIGS. 1A and 1B illustrate an exemplary layout 100 of an exemplary conventional IC cell 102. FIG. 1A is a top-view of the layout 100 of the IC cell 102, while FIG. 1B is a top-view of the layout 100 of the IC cell 102 that illustrates exemplary mandrels 104(1)-104(3), first spacers 106(1)-106(5), and second spacers 108(1)-108(8) employed in the conventional SAQP process that are removed during the SAQP process. Components of the layout 100 of the IC cell 102 are referred to with common element numbers in FIGS. 1A, 1B.

With particular reference to FIG. 1A, the IC cell 102 includes a first voltage rail 110 configured to receive a first voltage, such as a supply voltage, and a second voltage rail 112 configured to receive a second voltage, such as a ground voltage. The IC cell 102 also includes routing lines 114(1)-114(5) disposed over corresponding routing tracks 116(1)-116(5). Each routing line 114(1)-114(5) is used, in part, to interconnect elements in the IC cell 102 to form various active devices (not shown), such as particular logic gates.

With particular reference to FIG. 1B, the conventional SAQP process used to fabricate the IC cell 102 employs various elements to achieve the layout 100. More specifically, the SAQP process includes employing the mandrels 104(1)-104(3) and employing the first spacers 106(1)-106(5) disposed adjacent to a corresponding side of the corresponding mandrel 104(1)-104(3). The second spacers 108(1)-108(8) are disposed adjacent to a corresponding side of the corresponding first spacer 106(1)-106(5). Further, the first voltage rail 110 is disposed between the corresponding second spacers 108(1), 108(2), and the second voltage rail 112 is disposed between the corresponding second spacers 108(7), 108(8).

With continuing reference to FIG. 1B, the routing lines 114(1)-114(5) are disposed over each corresponding routing track 116(1)-116(5) formed between the respective second spacers 108(2)-108(7). In particular, the routing line 114(1) is disposed over the routing track 116(1) formed between the second spacers 108(2), 108(3), while the routing line 114(2) is disposed over the routing track 116(2) formed between the second spacers 108(3), 108(4). Additionally, the routing line 114(3) is disposed over the routing track 116(3) formed between the second spacers 108(4), 108(5), while the routing line 114(4) is disposed over the routing track 116(4) formed between the second spacers 108(5), 108(6). Further, the routing line 114(5) is disposed over the routing track 116(5) formed between the second spacers 108(6), 108(7).

With continuing reference to FIG. 1B, fabricating the IC cell 102 using the conventional SAQP process as described above results in the IC cell 102 having an odd number of routing tracks 116(1)-116(5) as a result of two (2) of the second spacers 108(1)-108(8) being disposed adjacent to each of the first spacers 106(1)-106(5). Further, each of the routing tracks 116(1)-116(5), and thus the routing lines 114(1)-114(5), has a line width $W_{LINE}$ corresponding to a spacer width $W_{SP}$ of the first spacers 106(1)-106(5). Additionally, the first and second voltage rails 110, 112 each have a rail width $W_{RAIL}$ designed to achieve particular voltage drop (e.g., current-resistance (IR) drop) and current density parameters. To achieve such parameters, the rail width $W_{RAIL}$ is a function of a rail mandrel width $W_{RM}$ of the mandrel 104(3) and a distance $D_M$ between the mandrels 104(1), 104(2). In particular, in the conventional SAQP process described above, the rail mandrel width $W_{RM}$ and the distance $D_M$ are set such that the rail width $W_{RAIL}$ in the IC cell 102 is approximately equal to three (3) times a metal pitch MP minus the line width $W_{LINE}$. Because the line width $W_{LINE}$ and the rail width $W_{RAIL}$ are dependent on the elements used in the SAQP process, reducing a cell height $H_{CELL}$ of the IC cell 102 is limited by the sizing and spacing of the respective elements.

For example, if the smallest available spacer width $W_{SP}$ is approximately equal to fourteen (14) nanometers, then the smallest available line width $W_{LINE}$ is approximately equal to fourteen (14) nm. Such a spacer width $W_{SP}$ and line width $W_{LINE}$ result in the metal pitch MP that is approximately equal to twenty-eight (28) nm, which is smaller than a metal pitch achievable when using light-based lithography. The smallest available rail width $W_{RAIL}$ corresponding to a fourteen (14) nm line width $W_{LINE}$ is approximately equal to seventy (70) nm (i.e., [28 nm*3]−14 nm=70 nm). Further, the cell height $H_{CELL}$ measured from an upper point H1 of the first voltage rail 110 to an upper point H2 of the second voltage rail 112 is approximately equal to 224 nm. However, the cell height $H_{CELL}$ achievable by the SAQP process described above cannot be scaled down to meet the demand for continued miniaturization of ICs. Thus, it would be advantageous to achieve the reduced metal pitch MP of SAQP while also reducing area of corresponding ICs.

Figure 2B:
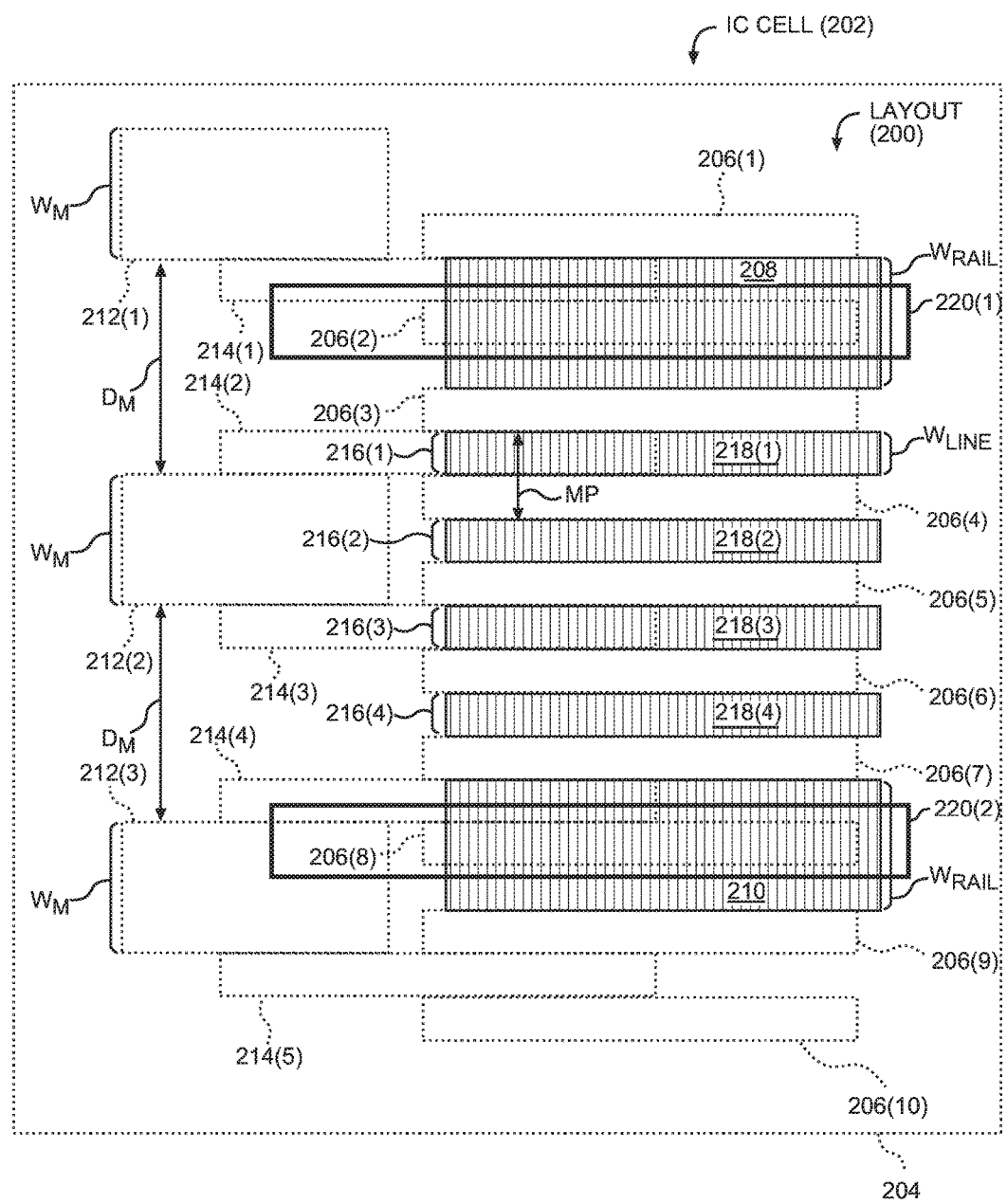
FIG. 2B is a top-view diagram of the IC cell of FIG. 2A that illustrates exemplary mandrels, spacers, and a cut pattern mask employed in the modified SAQP process.

In this regard, FIGS. 2A and 2B illustrate an exemplary layout 200 of an exemplary IC cell 202 fabricated using a modified SAQP process that includes using a cut pattern mask 204 to remove second spacers 206(2), 206(8) corresponding to first and second voltage rails 208, 210 so as to achieve a reduced area compared to the conventional IC cell 102 in FIG. 1A. FIG. 2A is a top-view of the layout 200 of the IC cell 202, while FIG. 2B is a top-view of the layout 200 of the IC cell 202 that illustrates exemplary mandrels 212(1)-212(3), first spacers 214(1)-214(5), second spacers 206(1)-206(10), and the cut pattern mask 204 employed in the modified SAQP process. Components of the layout 200 of the IC cell 202 are referred to with common element numbers in FIGS. 2A and 2B.

With particular reference to FIG. 2A, the IC cell 202 includes the first voltage rail 208 configured to receive a first voltage, such as a supply voltage, and the second voltage rail 210 configured to receive a second voltage, such as a ground voltage. The IC cell 202 also includes an even number of routing tracks 216(1)-216(4) formed between and substantially parallel to the first and second voltage rails 208, 210. Further, the IC cell 202 includes routing lines 218(1)-218(4) disposed over each corresponding routing track 216(1)-216(4). Each routing line 218(1)-218(4) is used, in part, to interconnect elements in the IC cell 202 to form various active devices (not shown), such as particular logic gates. Although this aspect includes four (4) routing tracks 216(1)-216(4) and four (4) routing lines 218(1)-218(4), other aspects may include any number M of routing tracks 216(1)-216(M) and routing lines 218(1)-218(M) (i.e., M can be odd or even).

With particular reference to FIG. 2B, as described in more detail below in the description of FIG. 3, the modified SAQP process used to fabricate the IC cell 202 employs various elements to achieve the layout 200. More specifically, the modified SAQP process includes employing the mandrels 212(1)-212(3), each of which may have a mandrel width $W_M$ and is separated from neighboring mandrels 212(1)-212(3) by a mandrel distance $D_M$. The modified SAQP process also includes employing the first spacers 214(1)-214(5) disposed adjacent to a corresponding side of the corresponding mandrel 212(1)-212(3). Further, the second spacers 206(1)-206(10) are disposed adjacent to a corresponding side of the corresponding first spacer 214(1)-214(5).

With continuing reference to FIG. 2B, the cut pattern mask 204 is used to remove the second spacers 206(2), 206(8) so as to make room for the first and second voltage rails 208, 210. In particular, in this aspect, the cut pattern mask 204 includes a first opening 220(1) that exposes the second spacer 206(2). The second spacer 206(2), and thus the first opening 220(1), corresponds to an area in which the first voltage rail 208 is to be disposed. In the absence of the second spacer 206(2), the first voltage rail 208 is disposed between the corresponding second spacers 206(1), 206(3). The cut pattern mask 204 also includes a second opening 220(2) that exposes the second spacer 206(8). The second spacer 206(8), and thus the second opening 220(2), corresponds to an area in which the second voltage rail 210 is to be disposed. In the absence of the second spacer 206(8), the second voltage rail 210 is disposed between the corresponding second spacers 206(7), 206(9).

With continuing reference to FIG. 2B, the IC cell 202 also includes the routing tracks 216(1)-216(4) formed between corresponding sets of the second spacers 206(1)-206(10). In particular, the routing track 216(1) is formed between the second spacers 206(3), 206(4), and the routing track 216(2) is formed between the second spacers 206(4), 206(5). Additionally, the routing track 216(3) is formed between the second spacers 206(5), 206(6), and the routing track 216(4) is formed between the second spacers 206(6), 206(7). As previously described, the routing lines 218(1)-218(4) are disposed over the corresponding routing tracks 216(1)-216(4). In particular, the routing line 218(1) is disposed over the routing track 216(1), the routing line 218(2) is disposed over the routing track 216(2), the routing line 218(3) is disposed over the routing track 216(3), and the routing line 218(4) is disposed over the routing track 216(4).

With continuing reference to FIG. 2B, fabricating the IC cell 202 as described above results in the IC cell 202 have a smaller cell height $H_{CELL}$, and thus a smaller area, than the IC cell 102 in FIG. 1A. In particular, the IC cell 202 includes the four (4) routing tracks 216(1)-216(4) and routing lines 218(1)-218(4) that have the line width $W_{LINE}$, as opposed to the five (5) routing tracks 116(1)-116(5) and routing lines 114(1)-114(5) in the IC cell 102 in FIG. 1A. Further, by making space for the first and second voltage rails 208, 210 by removing the second spacers 206(2), 206(8), the first and second voltage rails 208, 210 can be employed with a smaller rail width $W_{RAIL}$ compared to the first and second voltage rails 110, 112 in FIG. 1A. However, the rail width $W_{RAIL}$ in the IC cell 202 is designed so that the first and second voltage rails 208, 210 can achieve desired voltage drop (i.e., IR drop) and current density parameters. In this aspect, the first and second voltage rails 208, 210 have the rail width $W_{RAIL}$ approximately equal to two (2) times a metal pitch MP minus the line width $W_{LINE}$, compared to the rail width $W_{RAIL}$ approximately equal to three (3) the metal pitch MP minus the line width $W_{LINE}$ in FIG. 1A. In this manner, employing fewer routing tracks 216(1)-216(4) and routing lines 218(1)-218(4), as well as employing narrower first and second voltage rails 208, 210 allows the IC cell 202 to achieve a reduced area compared to the IC cell 102 in FIG. 1A.

As a non-limiting example, if the line width $W_{LINE}$ is approximately equal to fourteen (14) nm, then a metal pitch MP is approximately equal to twenty-eight (28) nm. Further, the rail width $W_{RAIL}$ corresponding to the fourteen (14) nm line width $W_{LINE}$ is approximately equal to forty-two (42) nm (i.e., [28 nm*2]−14 nm=42 nm). The cell height $H_{CELL}$ measured from an upper point H1 of the first voltage rail 208 to an upper point H2 of the second voltage rail 210 is approximately equal to 168 nm. Thus, the IC cell 202 achieves the reduced metal pitch MP while also having a reduced area compared to the IC cell 102 in FIG. 1A fabricated using the conventional SAQP process.

Figure 3:
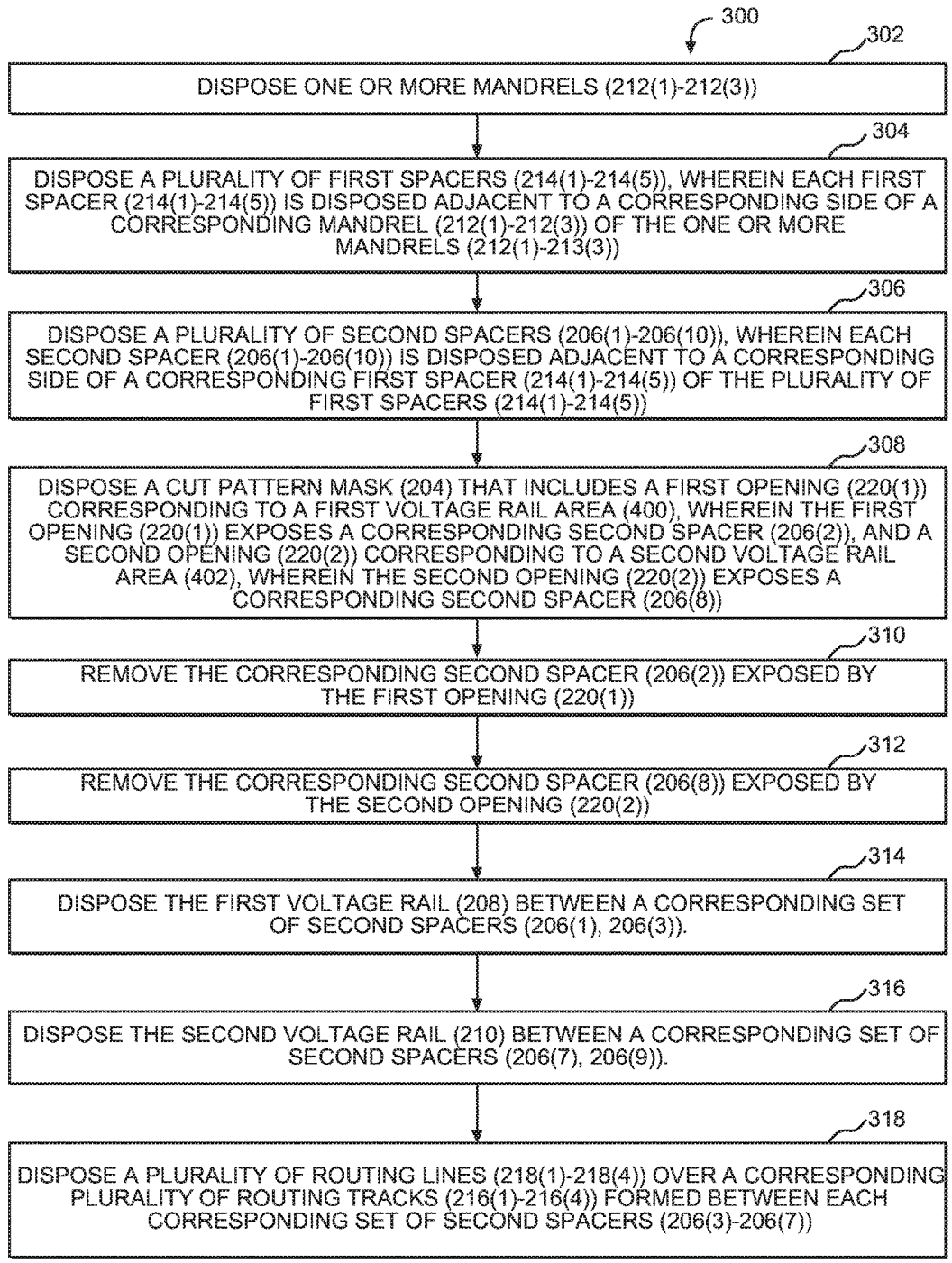
FIG. 3 is a flowchart illustrating an exemplary modified SAQP process for fabricating the IC cell in FIG. 2A, wherein the modified SAQP process uses the cut pattern mask to remove spacers corresponding to voltage rails so as to achieve the reduced area.

FIG. 3 illustrates an exemplary modified SAQP fabrication process 300 (also referred to herein as the "fabrication process 300") employed to fabricate the IC cell 202 of FIGS. 2A and 2B. Further, FIGS. 4A-4I provide top-view diagrams illustrating the IC cell 202 during the various steps of the fabrication process 300. The top-view diagrams illustrating the IC cell 202 in FIGS. 4A-4I will be discussed in conjunction with the discussion of the exemplary fabrication steps in the fabrication process 300 in FIG. 3.

Figure 4A:
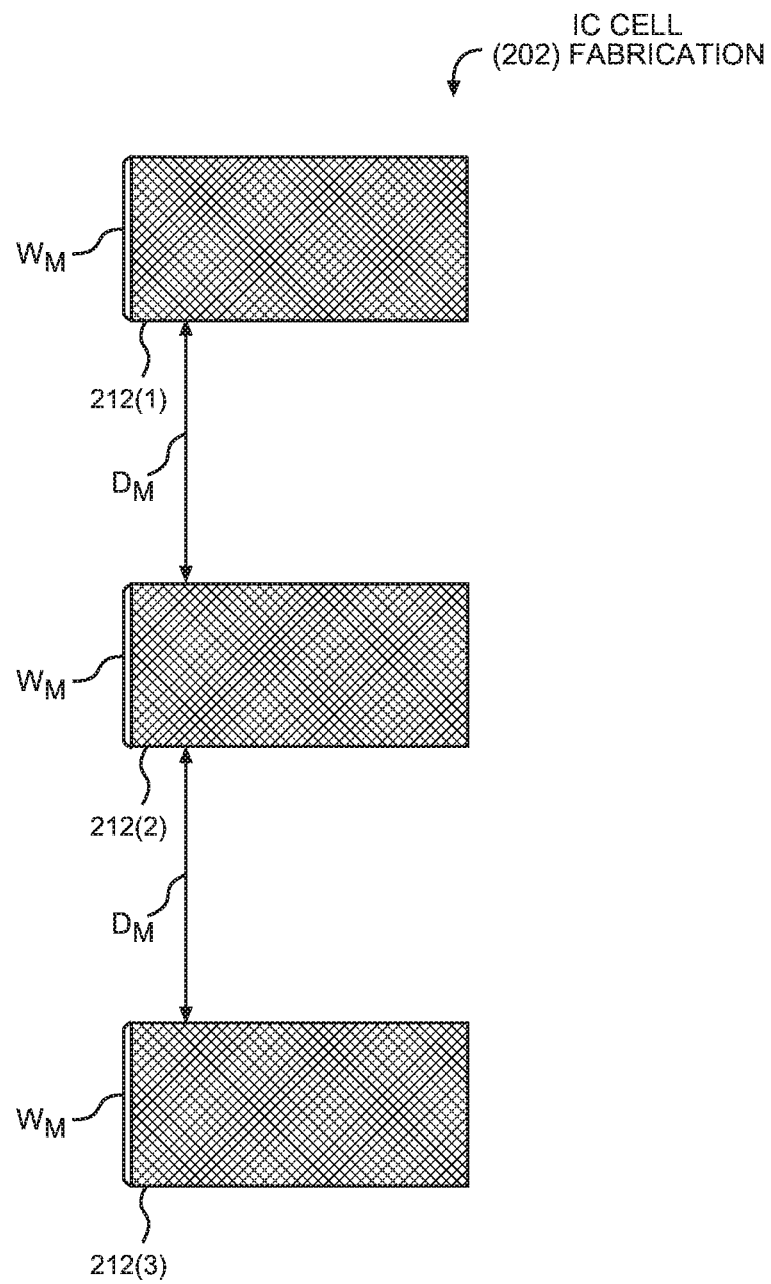
FIGS. 4A-4I are top-view diagrams illustrating the IC cell in FIG. 2A at different fabrication steps in the modified SAQP process in FIG. 3.
Figure 4B:
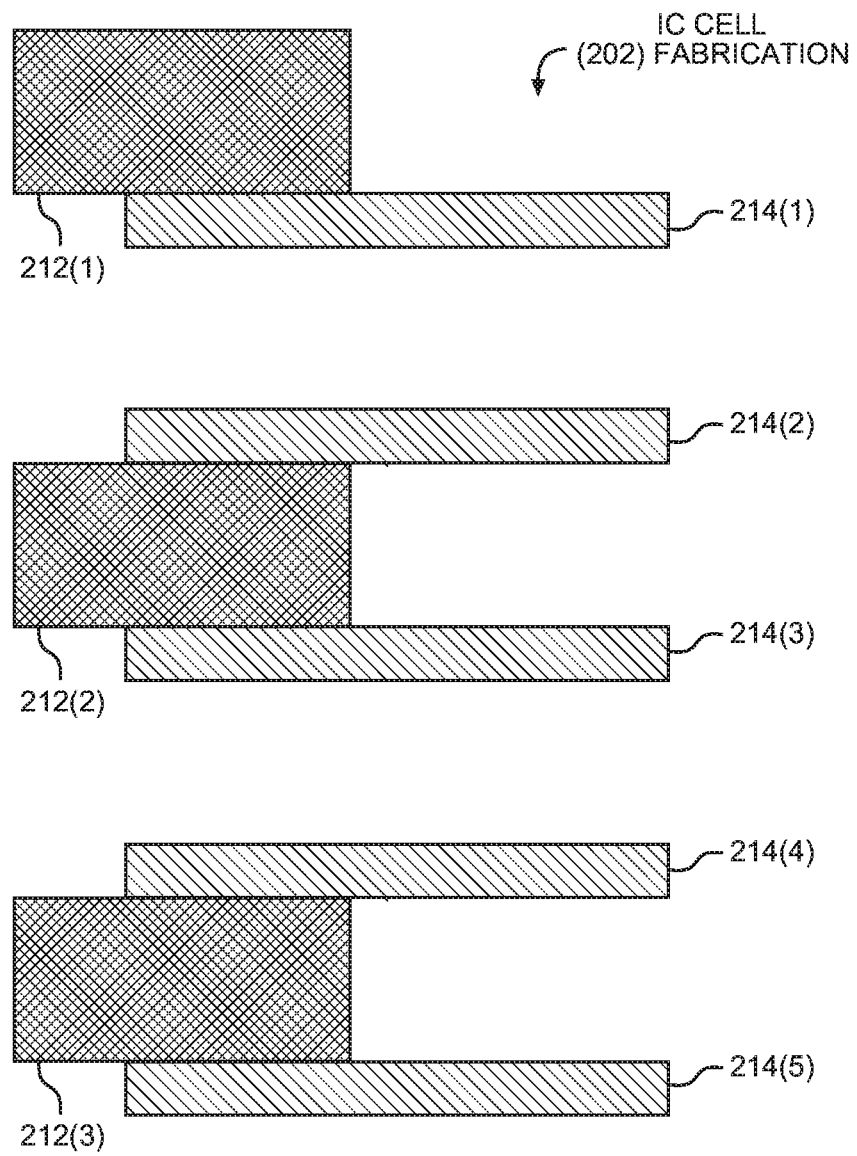
Figure 4C:
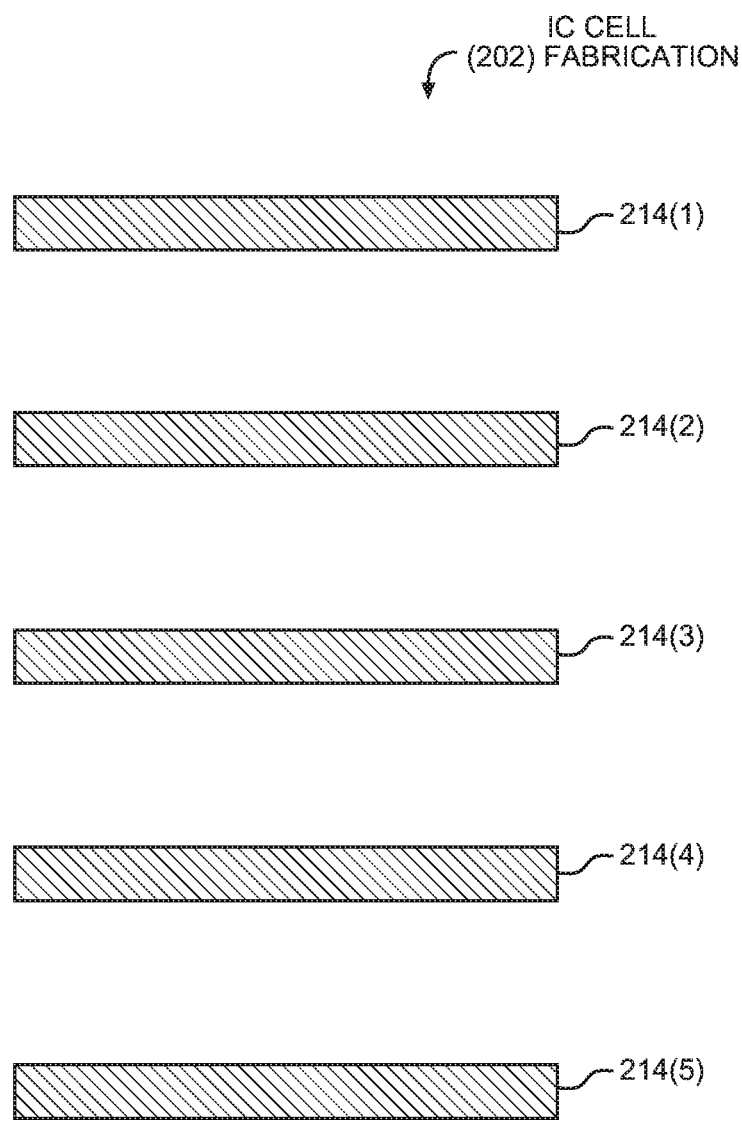

In this regard, the fabrication process 300 in FIG. 3 includes disposing the mandrels 212(1)-212(3) (block 302, FIG. 4A). In this example, unlike the mandrels 104(1)-104(3) in FIG. 1B, the mandrels 212(1)-212(3) each have a substantially equal mandrel width $W_M$. Additionally, the mandrels 212(1), 212(2) and 212(2), 212(3) are separated by a substantially equal distance $D_M$. Such uniformity in the sizing and spacing of the mandrels 212(1)-212(3) is possible due to designing the first and second voltage rails 208, 210 to be narrower than the first and second voltage rails 110, 112 in FIG. 1A. The fabrication process 300 also includes disposing the first spacers 214(1)-214(5) such that each first spacer 214(1)-214(5) is disposed adjacent to a corresponding side of a corresponding mandrel 212(1)-212(3) (block 304, FIG. 4B). For example, the first spacer 214(1) is disposed adjacent to a corresponding side of the mandrel 212(1), the first spacers 214(2), 214(3) are disposed adjacent to a corresponding side of the mandrel 212(2), and the first spacers 214(4), 214(5) are disposed adjacent to a corresponding side of the mandrel 212(3). In this aspect, the first spacers 214(1)-214(5) may be disposed by disposing a material covering the entire area of the IC cell 202, and etching the material such that the first spacers 214(1)-214(5) remain. Additionally, in this aspect, as illustrated in FIG. 4C, the mandrels 212(1)-212(3) are removed following disposition of the first spacers 214(1)-214(5).

Figure 4D:
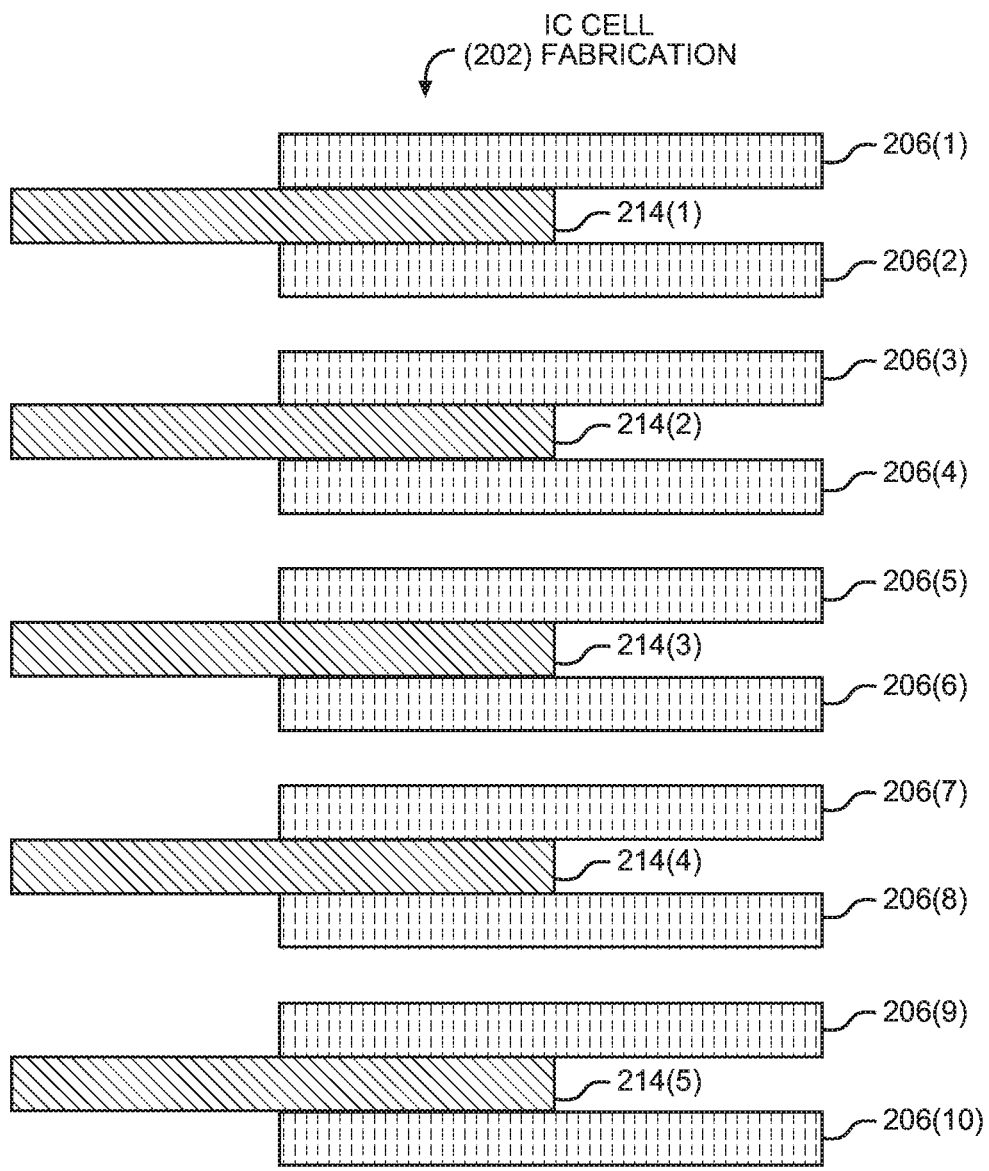
Figure 4E:
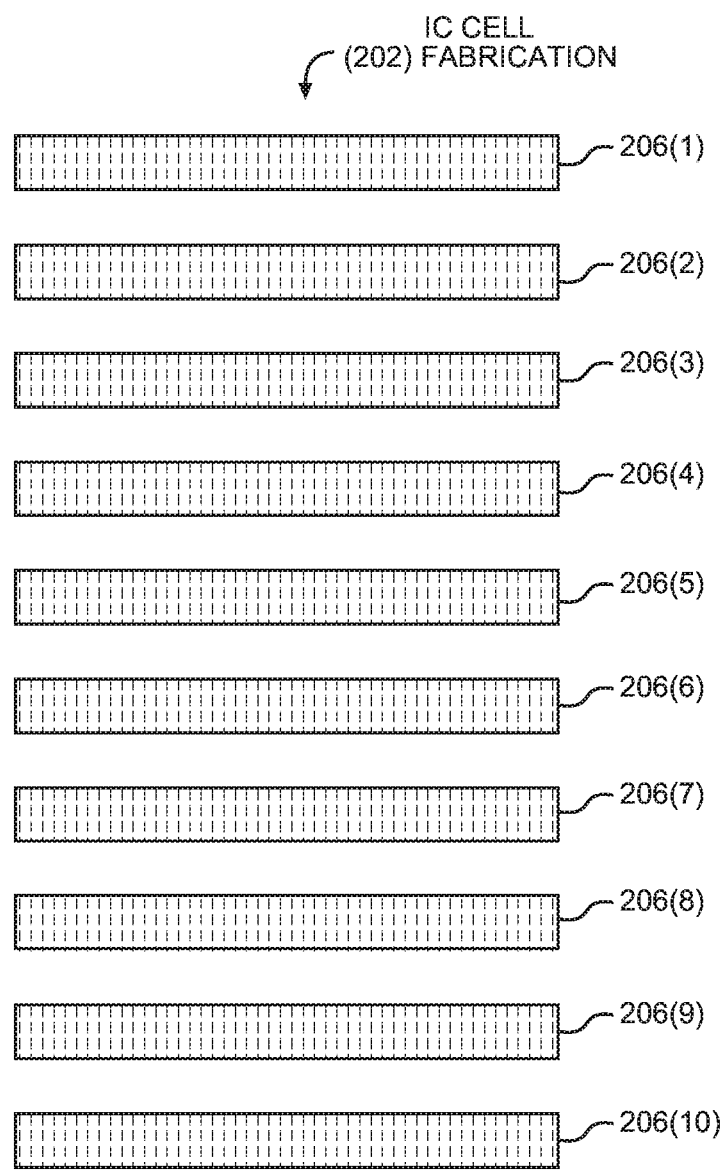

With continuing reference to FIG. 3, the fabrication process 300 also includes disposing the second spacers 206(1)-206(10) such that each second spacer 206(1)-206(10) is disposed adjacent to a corresponding side of a corresponding first spacer 214(1)-214(5) (block 306, FIG. 4D). For example, the second spacers 206(1), 206(2) are disposed adjacent to a corresponding side of the first spacer 214(1), the second spacers 206(3), 206(4) are disposed adjacent to a corresponding side of the first spacer 214(2), and the second spacers 206(5), 206(6) are disposed adjacent to a corresponding side of the first spacer 214(3). Additionally, the second spacers 206(7), 206(8) are disposed adjacent to a corresponding side of the first spacer 214(4), while the second spacers 206(9), 206(10) are disposed adjacent to a corresponding side of the first spacer 214(5). In this aspect, the second spacers 206(1)-206(10) may be disposed by disposing a material covering the entire area of the IC cell 202, and etching the material such that the second spacers 206(1)-206(10) remain. Additionally, in this aspect, as illustrated in FIG. 4E, the first spacers 214(1)-214(5) are removed following disposition of the second spacers 206(1)-206(10).

Figure 4F:
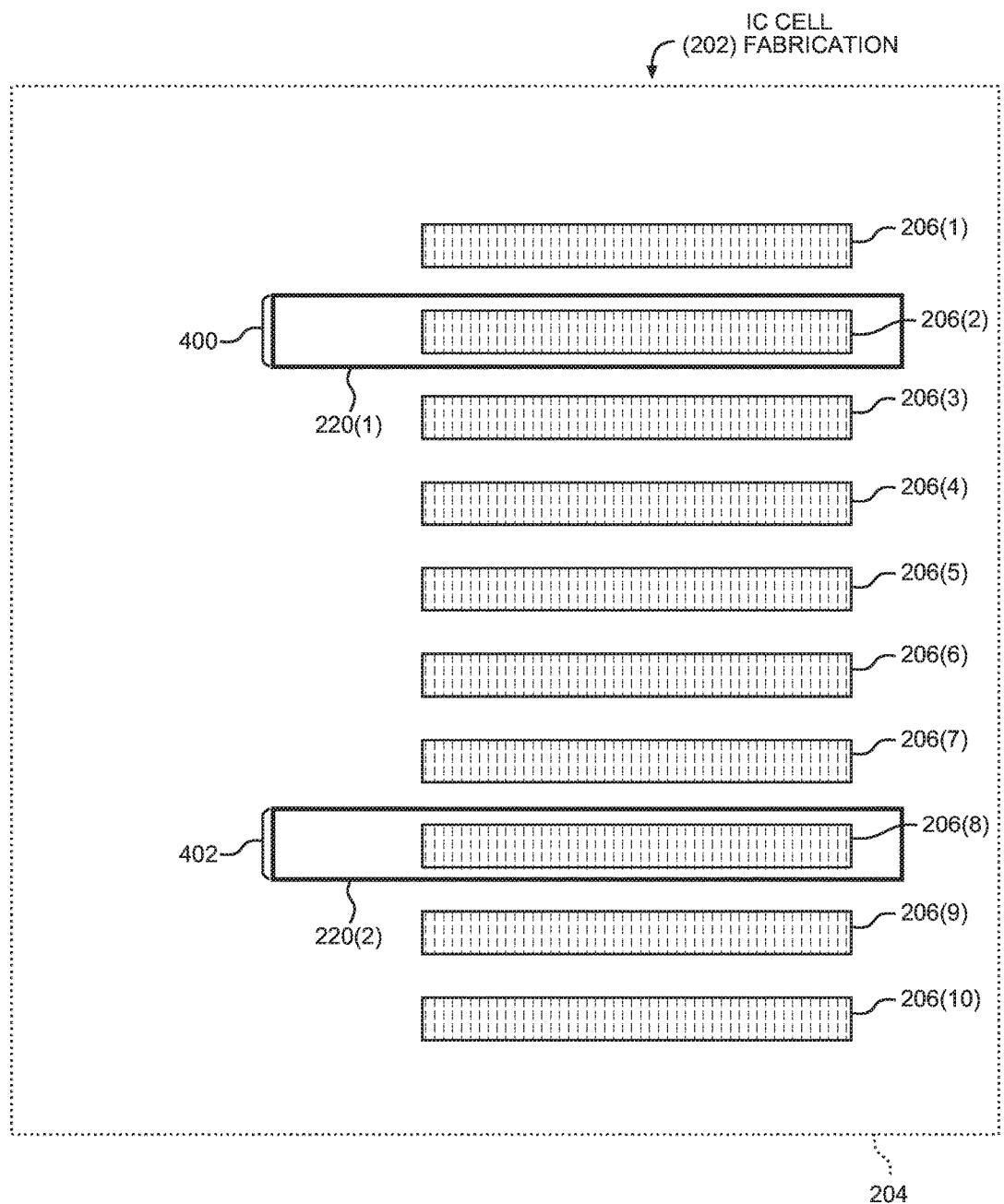
Figure 4G:
Figure 4G:
Figure 4G:
Figure 4G:
Figure 4G:
Figure 4G:
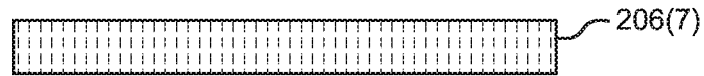
Figure 4G:
Figure 4G:

With continuing reference to FIG. 3, the fabrication process 300 also includes disposing the cut pattern mask 204 that includes the first opening 220(1) corresponding to a first voltage rail area 400 such that first opening 220(1) exposes the corresponding second spacer 206(2) (block 308, FIG. 4F). As also illustrated in FIG. 4F, the cut pattern mask 204 further includes the second opening 220(2) corresponding to a second voltage rail area 402 such that the second opening 220(2) exposes the corresponding second spacer 206(8). The fabrication process 300 also includes removing the corresponding second spacer 206(2) exposed by the first opening 220(1) (block 310, FIG. 4G). The fabrication process 300 also includes removing the corresponding second spacer 206(8) exposed by the second opening 220(2) (block 312, FIG. 4G). The fabrication process 300 further includes disposing the first voltage rail 208 between the corresponding set of second spacers 206(1), 206(3) (block 314, FIG. 4H). Additionally, the fabrication process 300 includes disposing the second voltage rail 210 between the corresponding set of second spacers 206(7), 206(9) (block 316, FIG. 4H).

Figure 4H:
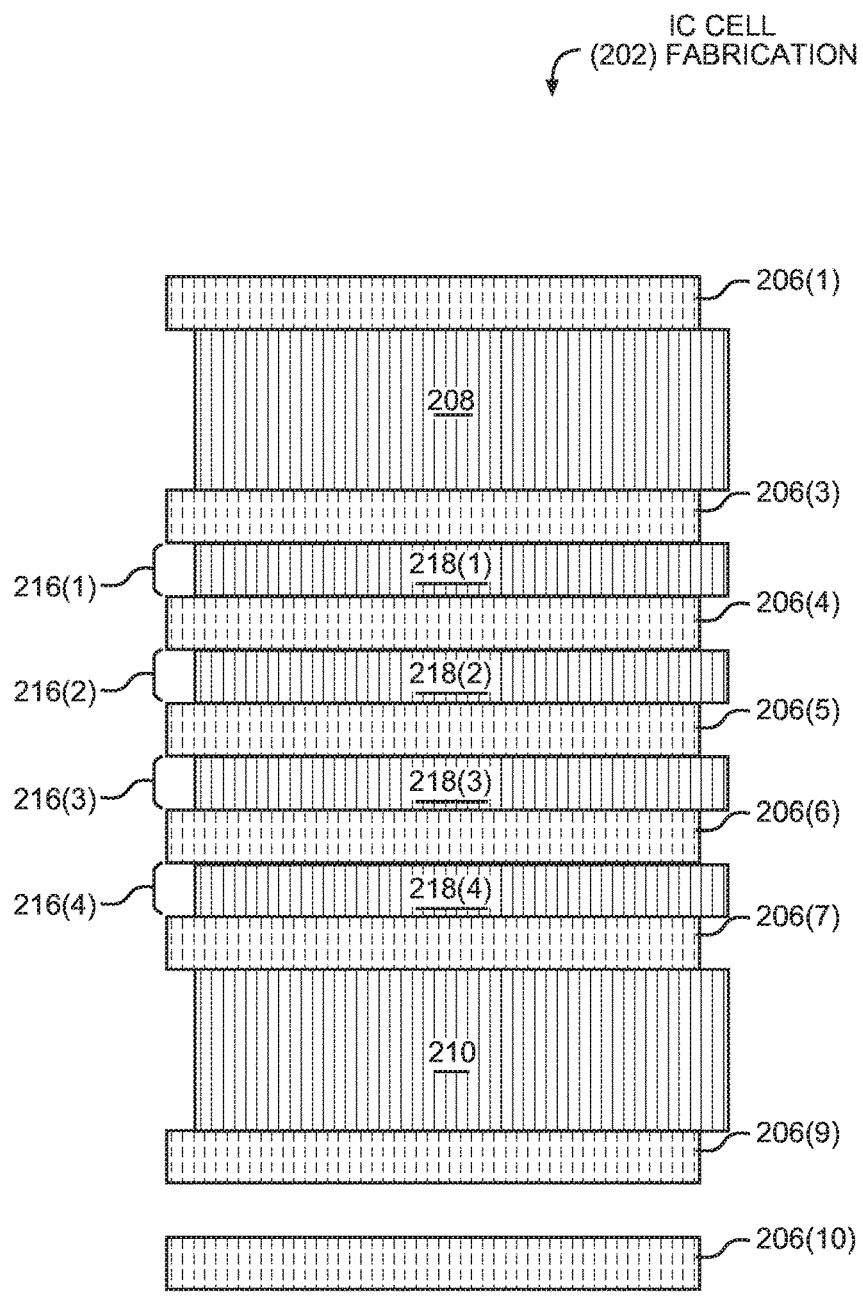
Figure 4I:
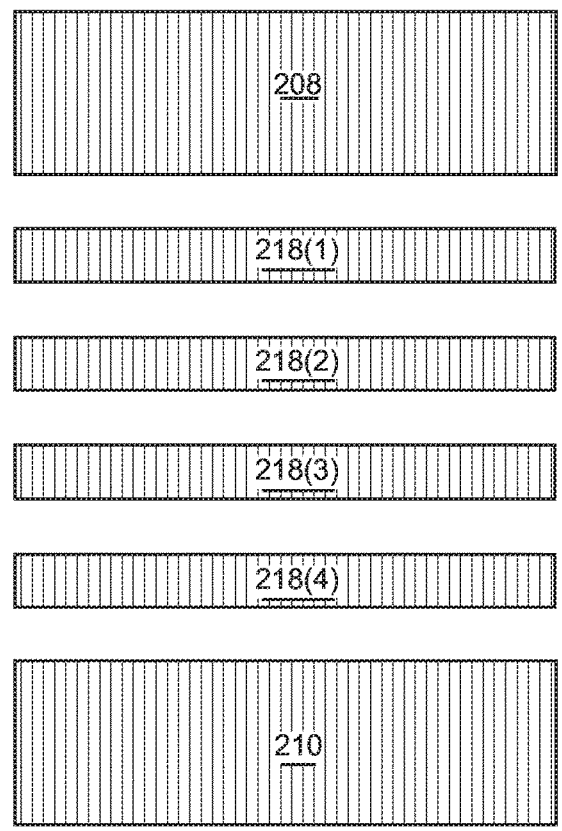

With continuing reference to FIG. 3, the fabrication process 300 also includes disposing the routing lines 218(1)-218(4) over the corresponding routing tracks 216(1)-216(4) formed between each corresponding set of second spacers 206(3)-206(7) (block 318, FIG. 4H). Additionally, in this aspect, as illustrated in FIG. 4I, the second spacers 206(1), 206(3)-206(7), 206(9), and 206(10) are removed following disposition of the first and second voltage rails 208, 210 and the routing lines 218(1)-218(4).

Figure 5:
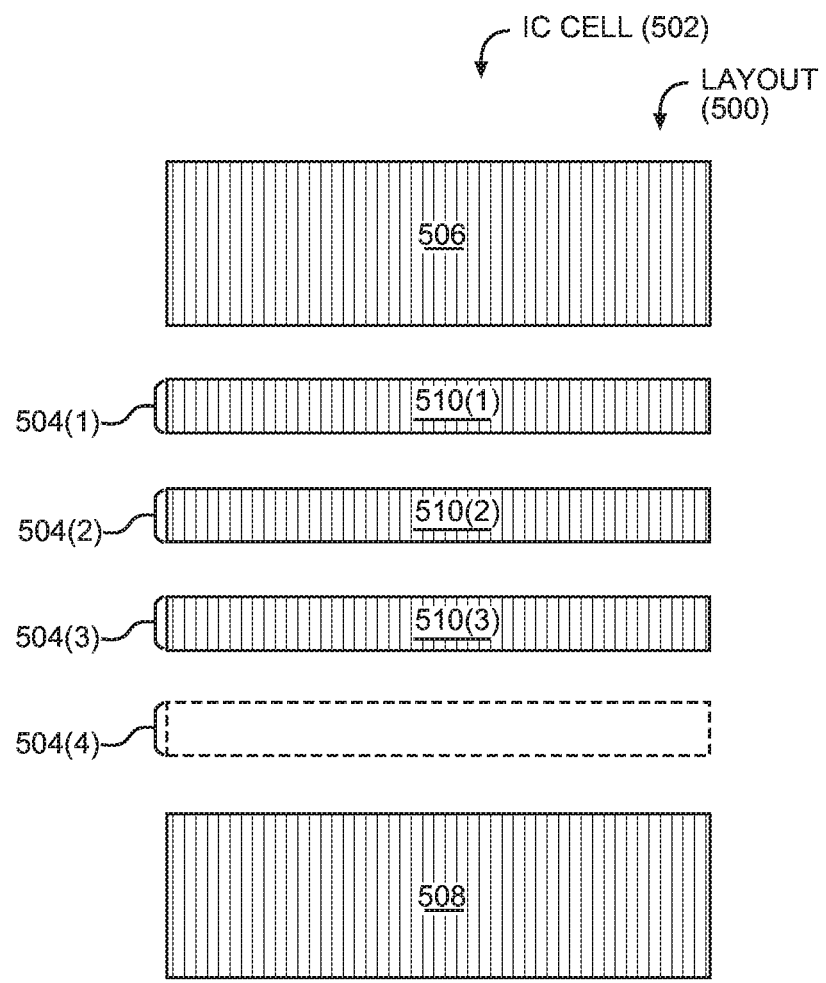
FIG. 5 is a top-view diagram of an exemplary IC cell fabricated using a modified SAQP process that uses a cut pattern mask to remove spacers corresponding to voltage rails so as to achieve a reduced area, while also employing a dummy routing track.

In addition to the IC cell 202 in FIGS. 2A and 2B, the modified SAQP fabrication process according to aspects herein may fabricate IC cells with alternative features to reduce parasitic capacitance. In this regard, FIG. 5 illustrates a top-view of an exemplary layout 500 of an exemplary IC cell 502 fabricated using a modified SAQP fabrication process. The IC cell 502 includes a routing track 504(4) employed as a dummy routing track. In particular, the IC cell 502 includes a first voltage rail 506 configured to receive a first voltage, such as a supply voltage, and a second voltage rail 508 configured to receive a second voltage, such as a ground voltage. The IC cell 502 also includes an even number of routing tracks 504(1)-504(4) formed between and substantially parallel to the first and second voltage rails 506, 508. Further, the IC cell 502 includes routing lines 510(1)-510(3) disposed over a corresponding routing track 504(1)-504(3). Importantly, there is no corresponding routing line 510 disposed over the routing track 504(4), resulting in the routing track 504(4) being referred to as a "dummy routing track 504(4)." In this manner, the IC cell 502 may employ the dummy routing track 504(4) to reduce a parasitic capacitance of the IC cell 502.

The elements described herein are sometimes referred to as means for achieving a particular property. In this regard, the first voltage rail 208 is sometimes referred to herein as "a means for receiving a first voltage," and the second voltage rail 210 is sometimes referred to herein as "means for receiving a second voltage substantially parallel to the means for receiving the first voltage." Additionally, the routing tracks 216(1)-216(4) are sometimes referred to herein as "an even plurality of means for routing formed between and substantially parallel to the means for receiving the first voltage and the means for receiving the second voltage." The routing lines 218(1)-218(4) are sometimes referred to herein as "a plurality of means for transferring current, wherein each means for transferring current of the plurality of means for transferring current is disposed over a corresponding means for routing of the even plurality of means for routing." Further, the dummy routing track 504(4) is sometimes referred to herein as "a means for dummy routing, wherein a means for transferring current is not disposed over the means for dummy routing."

The modified SAQP processes using cut pattern masks to fabricate IC cells with reduced area according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
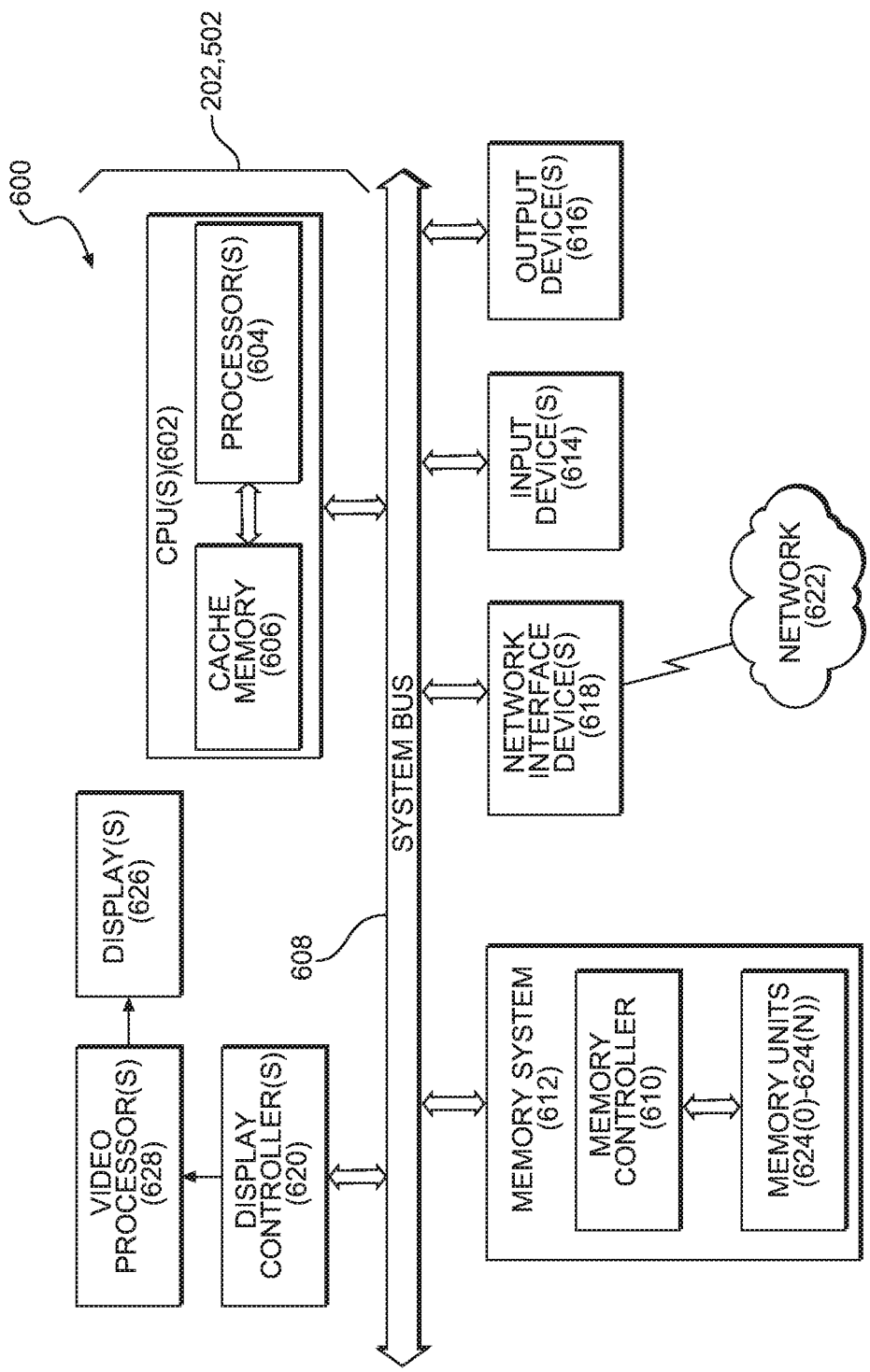
FIG. 6 is a block diagram of an exemplary processor-based system that can include elements that employ the IC cells of FIG. 2A and FIG. 5 fabricated using a modified SAQP process that uses a cut pattern mask to remove spacers corresponding to voltage rails so as to achieve a reduced area.

In this regard, FIG. 6 illustrates an example of a processor-based system 600 that can employ elements that include the IC cell 202 and/or the IC cell 502 illustrated in FIGS. 2A and 5, respectively. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
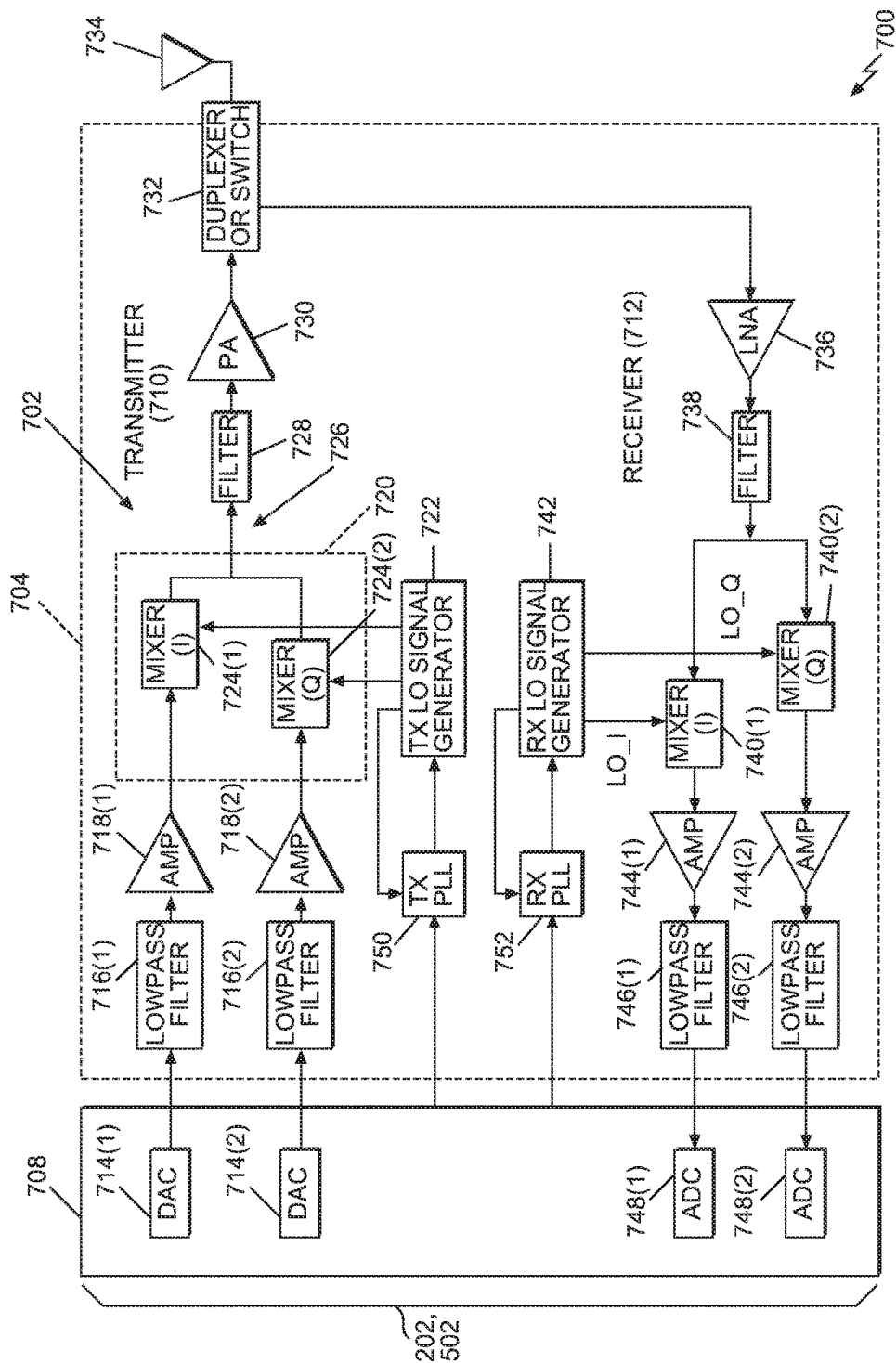
FIG. 7 is a block diagram of an exemplary wireless communications device that includes radio frequency (RF) components formed in an IC, wherein the RF components can include the IC cells of FIG. 2A and FIG. 5 fabricated using a modified SAQP process that uses a cut pattern mask to remove spacers corresponding to voltage rails so as to achieve a reduced area.

FIG. 7 illustrates an example of a wireless communications device 700 that can employ elements that include the IC cell 202 and/or the IC cell 502 illustrated in FIGS. 2A and 5, respectively. In this regard, the wireless communications device 700 may be provided in an IC 702. The wireless communications device 700 may include or be provided in any of the above referenced devices, as examples. As shown in FIG. 7, the wireless communications device 700 includes a transceiver 704 and a data processor 708. The data processor 708 may include a memory (not shown) to store data and program codes. The transceiver 704 includes a transmitter 710 and a receiver 712 that support bi-directional communication. In general, the wireless communications device 700 may include any number of transmitters and/or receivers for any number of communication systems and frequency bands. All or a portion of the transceiver 704 may be implemented on one or more analog ICs, radio frequency (RF) ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 700 in FIG. 7, the transmitter 710 and the receiver 712 are implemented with the direct-conversion architecture.

In the transmit path, the data processor 708 processes data to be transmitted and provides I and Q analog output signals to the transmitter 710. In the exemplary wireless communications device 700, the data processor 708 includes digital-to-analog-converters (DACs) 714(1), 714(2) for converting digital signals generated by the data processor 708 into the I and Q analog output signals (e.g., I and Q output currents), for further processing.

Within the transmitter 710, lowpass filters 716(1), 716(2) filter the I and Q analog output signals, respectively, to remove undesired signals caused by the prior digital-to-analog conversion. Amplifiers (AMP) 718(1), 718(2) amplify the signals from the lowpass filters 716(1), 716(2), respectively, and provide I and Q baseband signals. An upconverter 720 upconverts the I and Q baseband signals with I and Q transmit (TX) local oscillator (LO) signals through mixers 724(1), 724(2) from a TX LO signal generator 722 to provide an upconverted signal 726. A filter 728 filters the upconverted signal 726 to remove undesired signals caused by the frequency upconversion as well as noise in a receive frequency band. A power amplifier (PA) 730 amplifies the upconverted signal 726 from the filter 728 to obtain the desired output power level and provides a transmit RF signal. The transmit RF signal is routed through a duplexer or switch 732 and transmitted via an antenna 734.

In the receive path, the antenna 734 receives signals transmitted by base stations and provides a received RF signal, which is routed through the duplexer or switch 732 and provided to a low noise amplifier (LNA) 736. The duplexer or switch 732 is designed to operate with a specific RX-to-TX duplexer frequency separation, such that RX signals are isolated from TX signals. The received RF signal is amplified by the LNA 736 and filtered by a filter 738 to obtain a desired RF input signal. Downconversion mixers 740(1), 740(2) mix the output of the filter 738 with I and Q receive (RX) LO signals (i.e., LO_I and LO_Q) from an RX LO signal generator 742 to generate I and Q baseband signals. The I and Q baseband signals are amplified by amplifiers (AMP) 744(1), 744(2) and further filtered by lowpass filters 746(1), 746(2) to obtain I and Q analog input signals, which are provided to the data processor 708. In this example, the data processor 708 includes analog-to-digital-converters (ADCs) 748(1), 748(2) for converting the analog input signals into digital signals to be further processed by the data processor 708.

In the wireless communications device 700 in FIG. 7, the TX LO signal generator 722 generates the I and Q TX LO signals used for frequency upconversion, while the RX LO signal generator 742 generates the I and Q RX LO signals used for frequency downconversion. Each LO signal is a periodic signal with a particular fundamental frequency. A TX phase-locked loop (PLL) circuit 750 receives timing information from the data processor 708 and generates a control signal used to adjust the frequency and/or phase of the TX LO signals from the TX LO signal generator 722. Similarly, an RX phase-locked loop (PLL) circuit 752 receives timing information from the data processor 708 and generates a control signal used to adjust the frequency and/or phase of the RX LO signals from the RX LO signal generator 742.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC) cell, comprising:
   a first voltage rail configured to receive a first voltage;
   a second voltage rail disposed substantially parallel to the first voltage rail and configured to receive a second voltage;
   an even plurality of routing tracks formed between and substantially parallel to the first voltage rail and the second voltage rail; and
   a plurality of routing lines, wherein each routing line of the plurality of routing lines is disposed over a corresponding routing track of the even plurality of routing tracks, and wherein each routing line of the plurality of routing lines has a line width, the first voltage rail has a rail width approximately equal to two (2) times a metal pitch corresponding to the plurality of routing lines minus the line width, and the second voltage rail has the rail width.

2. The IC cell of claim 1, wherein:
the line width is approximately equal to fourteen (14) nanometers;
the metal pitch corresponding to the plurality of routing lines is approximately equal to twenty-eight (28) nm; and
the rail width is approximately equal to forty-two (42) nm.

3. The IC cell of claim 1, wherein one or more routing tracks comprises a dummy routing track, and wherein a routing line is not disposed over the dummy routing track.

4. The IC cell of claim 1, wherein the even plurality of routing tracks comprises four (4) routing tracks.

5. The IC cell of claim 4, wherein the plurality of routing lines comprises four (4) routing lines.

6. The IC cell of claim 4, wherein the plurality of routing lines comprises three (3) routing lines.

7. The IC cell of claim 1 integrated into an integrated circuit (IC).

8. The IC cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

9. An integrated circuit (IC) cell, comprising:
a means for receiving a first voltage;
a means for receiving a second voltage substantially parallel to the means for receiving the first voltage;
an even plurality of means for routing formed between and substantially parallel to the means for receiving the first voltage and the means for receiving the second voltage; and
a plurality of means for transferring current, wherein each means for transferring current of the plurality of means for transferring current is disposed over a corresponding means for routing of the even plurality of means for routing, and wherein each means for transferring current of the plurality of means for transferring current has a line width, the means for receiving the first voltage has a rail width approximately equal to two (2) times a metal pitch corresponding to the plurality of means for transferring current minus the line width, and the means for receiving the second voltage has the rail width.

10. The IC cell of claim 9, wherein one or more means for routing comprises a dummy means for routing, and wherein a means for transferring current is not disposed over the dummy means for routing.

11. The IC cell of claim 9, wherein the even plurality of means for routing comprises four (4) means for routing.

* * * * *